United States Patent [19]
Inoue

[11] Patent Number: 5,637,155
[45] Date of Patent: Jun. 10, 1997

[54] SOLAR CELL ARRAY AND ELECTRONIC EQUIPMENT HAVING THE SAME

[75] Inventor: Koji Inoue, Kawasaki, Japan

[73] Assignee: Canon Kabushiki Kaisha, Tokyo, Japan

[21] Appl. No.: 559,824

[22] Filed: Nov. 17, 1995

[30] Foreign Application Priority Data

Nov. 25, 1994 [JP] Japan .................................. 6-314289

[51] Int. Cl.⁶ .................................................. H01L 31/05
[52] U.S. Cl. .......................... 136/244; 136/291; 136/293; 364/700
[58] Field of Search ................................... 136/244, 291, 136/293; 364/700; 354/484, 170

[56] References Cited

U.S. PATENT DOCUMENTS 4,513,167  4/1985  Brandstetter ........................... 136/244
5,102,471  4/1992  Sasaki ..................................... 136/244

OTHER PUBLICATIONS

A. Brandstetter et al, Conference Record, 19th IEEE Photovoltair Specialists Conf. (1985), pp. 1025–1030.

Primary Examiner—Aaron Weisstuch
Attorney, Agent, or Firm—Fitzpatrick, Cella, Harper & Scinto

[57] ABSTRACT

Even when a portion of the incident light plane of a solar cell array is shaded, drastic decrease of photoelectric output is prevented by connecting a plurality of unit cells in parallel and a plurality of such parallel circuits are connected in series to form a solar cell array in which a plurality of unit cells are arranged in rows and columns in the incident light plane of the solar cell such that at least one of the unit cells forming the parallel circuit is arranged in other rows or columns from those of other unit cells forming the parallel circuit.

13 Claims, 7 Drawing Sheets

SOLAR CELL ARRAY AND ELECTRONIC EQUIPMENT HAVING THE SAME

BACKGROUND OF THE INVENTION

1. Field of the Invention

The present invention relates to a solar cell array and an electronic equipment having the solar cell array, and more particularly to a solar cell array capable of converting an input light such as sun light or artificial light to electricity and an electronic equipment such as a camera or a calculator having the solar cell array.

2. Related Background Art

A conventional solar cell array has a circuit configuration of a plurality of serially connected cell groups each having a plurality of parallelly connected unit cells. The solar cell array of such a circuit configuration has a planar arrangement of unit cells wherein the parallelly connected unit cells are arranged in rows (or columns) and the serially connected unit cells are arranged in columns (or rows).

Figure 1:
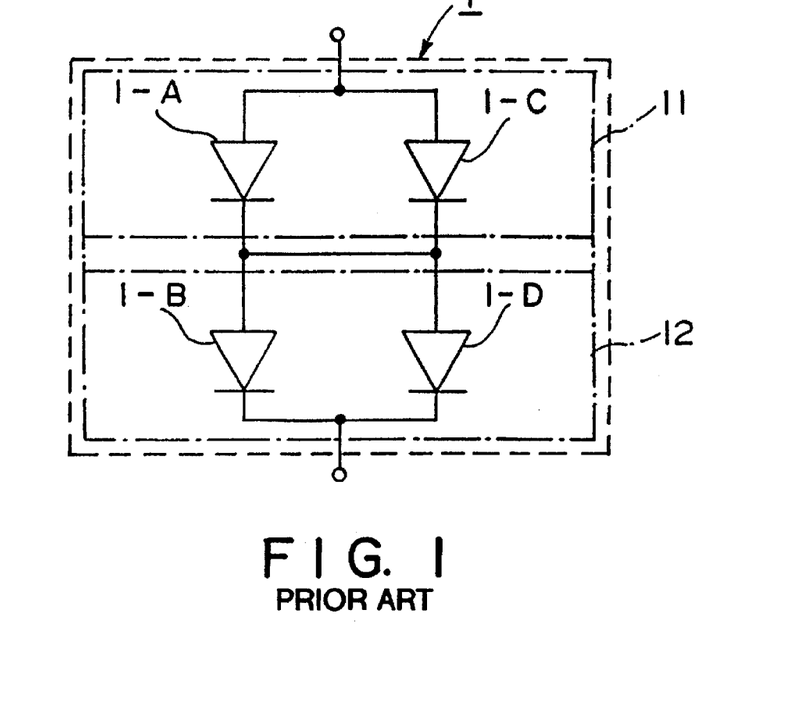
FIGS. 1, 3, and 5 show circuit diagrams of solar cell arrays illustrating prior art connections of unit cells, respectively.

For example, as shown in the circuit diagram of FIG. 1, two unit cells 1-A and 1-C, and two unit cells 1-B and 1-D are respectively connected in parallel to form parallel circuits 11 and 12, and the two parallel circuits 11 and 12 are connected in series to form a two-terminal solar cell array 1. Namely, as shown in the arrangement diagram of FIG. 2, the unit cells 1-A and 1-C and the unit cells 1-B and 1-D are respectively arranged in rows, and the unit cells 1-A and 1-B and the unit cells 1-C and 1-D are respectively arranged in columns to form a solar cell array 1a. Thus, in the prior art, the individual unit cells shown in FIG. 1 are usually arranged such that the parallelly connected unit cells are arranged in the same row (or column) and the serially connected unit cells are arranged in the same column (or row).

Figure 3:
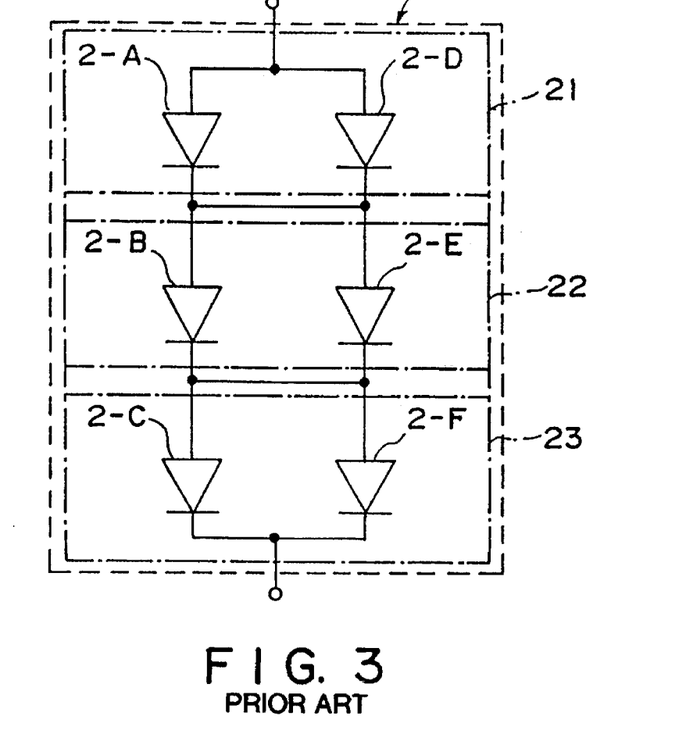
Figure 4:
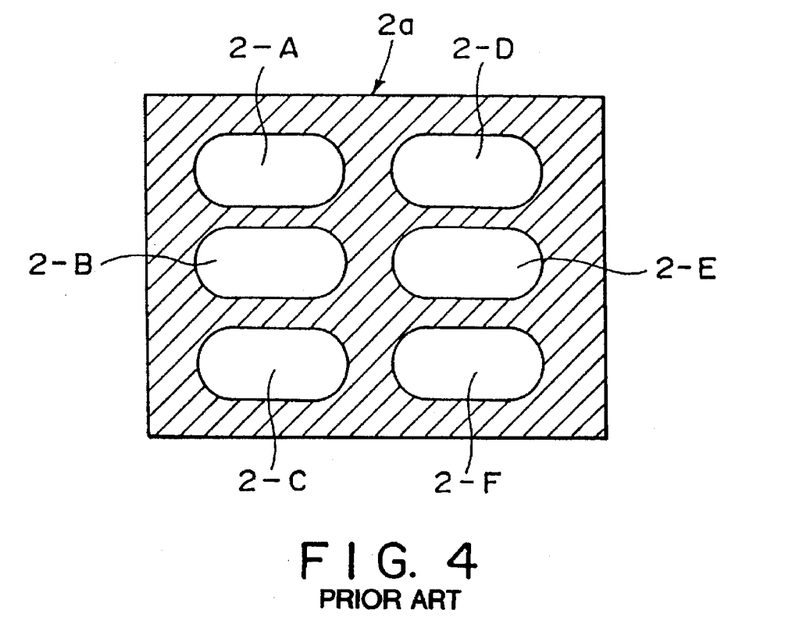
Figure 5:
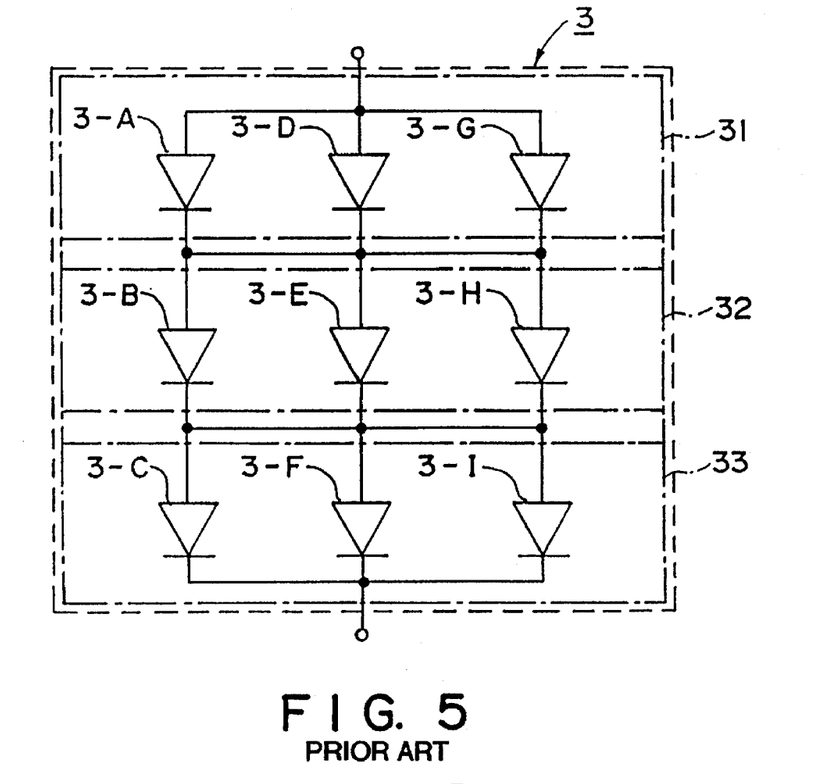
Figure 6:
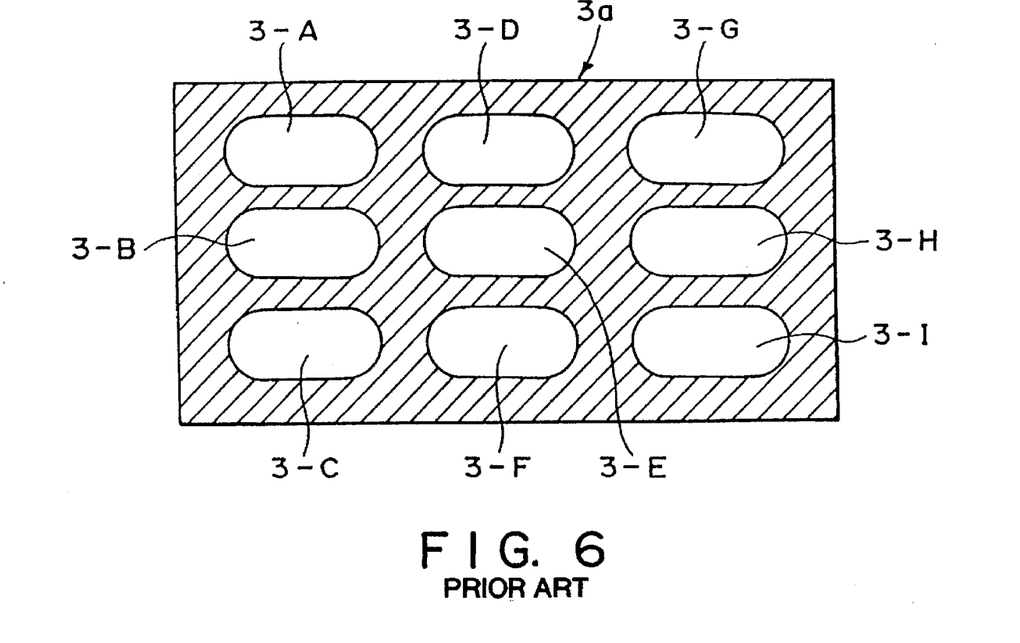

Similarly, as shown in the circuit diagram of FIG. 3, in a solar cell array 2 having pairs of unit cells 2-A and 2-D, 2-B and 2-E, and 2-C and 2-F connected in parallel and the three parallel circuits 21, 22, and 23 connected in series, the parallelly connected unit cells 2-A and 2-D, 2-B and 2-E, and 2-C and 2-F are arranged in respective rows (or columns), and the serially connected unit cells 2-A, 2-B and 2-C and 2-D, 2-E and 2-F are arranged in respective columns (or rows) to form a solar cell array 2a, as shown in the arrangement diagram of FIG. 4. As shown in FIGS. 5 and 6, in a three-row-by-three-column (3×3) solar cell array 3, the parallelly connected unit cells are arranged in respective rows (or columns) and the serially connected unit cells are arranged in respective columns (or rows) to form a solar cell array 3a.

However, in the solar cell array of the above arrangement, problems of shading of the solar cell array or the impediment of the incident light to a portion of the solar cell array are encountered.

The shaded area is formed on the side opposite to a light source and it is projected onto the solar cell array to reduce the illumination light intensity on the incident plane of the solar cell.

The shaded area is frequently formed to extend longitudinally or laterally. In the prior art described above, when a row or column of the solar cell array is shaded so that the power generation ability of the unit cells of that row or column is drastically reduced, the overall current generated by the solar cell array drastically decreases. This effect is explained below.

Figure 2:
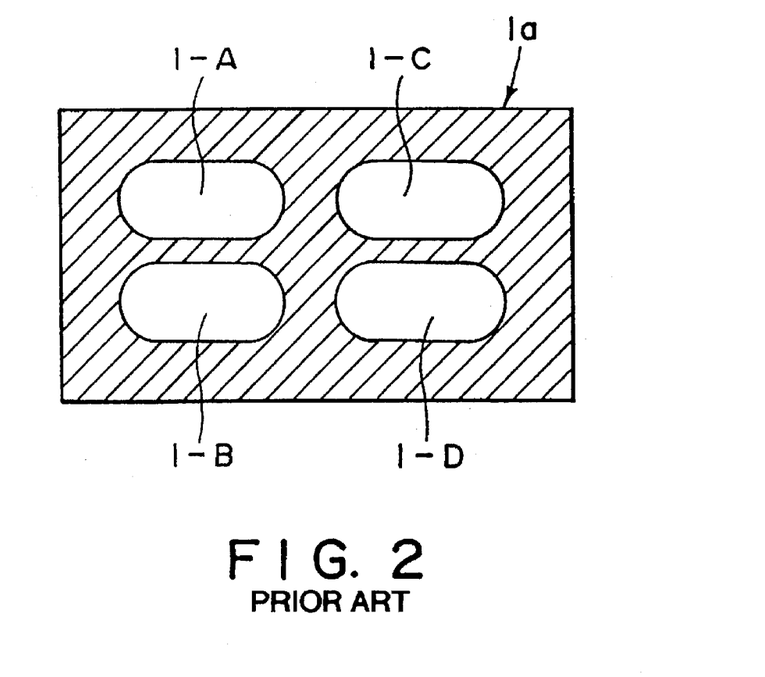
FIGS. 2, 4, and 6 show arrangements of the unit solar cells of the solar cell arrays of FIGS. 1, 3, and 5, respectively.

For example, in FIGS. 1 and 2, when a row of solar cells is shaded so as to reduce the power generation ability of, e.g., the unit cells 1-A and 1-C, the unit cells 1-A and 1-C are placed in an off state and the overall current generated by the solar cell array 1a may decrease to a small value on the order of the leakage currents of the cells 1-A and 1-C.

Similarly, in FIGS. 3 and 4, when a row of solar cells is shaded so as to drastically reduce the power generation ability of, e.g., the unit cells 2-A and 2-D, the overall current generated by the solar cell array 2a may decrease to a small amount on the order of the leakage currents of the unit cells 2-A and 2-D.

Similarly, in FIGS. 5 and 6, when a row of solar cells is shaded so as to drastically reduce the power generation ability of, e.g., the unit cells 3-A, 3-D, and 3-G, the overall current generated by the solar cell array 3a may decrease to a small amount on the order of the leakage currents of the unit cells 3-A, 3-D, and 3-G.

SUMMARY OF THE INVENTION

It is an object of the present invention to provide a solar cell array having unit cells arranged vertically (in rows) and horizontally (in columns) with a plurality of unit cells being connected in parallel circuits with a plurality of said parallel circuits being connected in series, which prevents an extreme decrease of output current even if the incident light plane is shaded.

It is another object of the present invention to provide a solar cell array which does not experience an extreme decrease of current output even if shaded by a finger, hair, or other object, and does not experience an extreme decrease of the output current even if adjacent vertical rows or horizontal columns of unit cells are shaded so that the power generation ability is maintained sufficient to drive a load equipment.

It is another object of the present invention to provide a solar cell array having a plurality of parallel circuits each comprising a plurality of unit cells electrically connected in series, wherein a plurality of said unit cells are arranged in rows and columns, and at least one unit cell forming each of the parallel circuits is arranged in a non-adjacent row or column, and to provide an electronic equipment having such a solar cell array.

DETAILED DESCRIPTION OF THE PREFERRED EMBODIMENTS

The above objects are attained by a solar cell array having a plurality of unit cells connected in parallel circuits and a plurality of such parallel circuits connected in series in an incident light plane, at least one unit cell of each parallel circuit being positioned in a different row and column from the other unit cells of the same parallel circuit.

Preferably, the individual unit cells of the parallel circuit are arranged such that adjacent unit cells are not arranged in the same row or same column, and the unit cells of a parallel circuit are arranged in different rows and columns from those of the other unit cells of the same parallel circuit.

In accordance with the present invention, even if a row or column of solar cells is shaded, at least one of the unit cells forming each parallel circuit belongs to a row or column different from the shaded row or column.

Accordingly, even if the row or column of solar cells is shaded and the power generation ability of that row or column is drastically reduced, at least one of the unit cells forming the parallel circuit does not lose its power generation ability and a photo-generated current flows through the series circuit containing the at least one unit cell so that the overall generated current of the solar cell array is prevented from being reduced to a small generation current on the order of leakage current.

Embodiment 1

Figure 7:
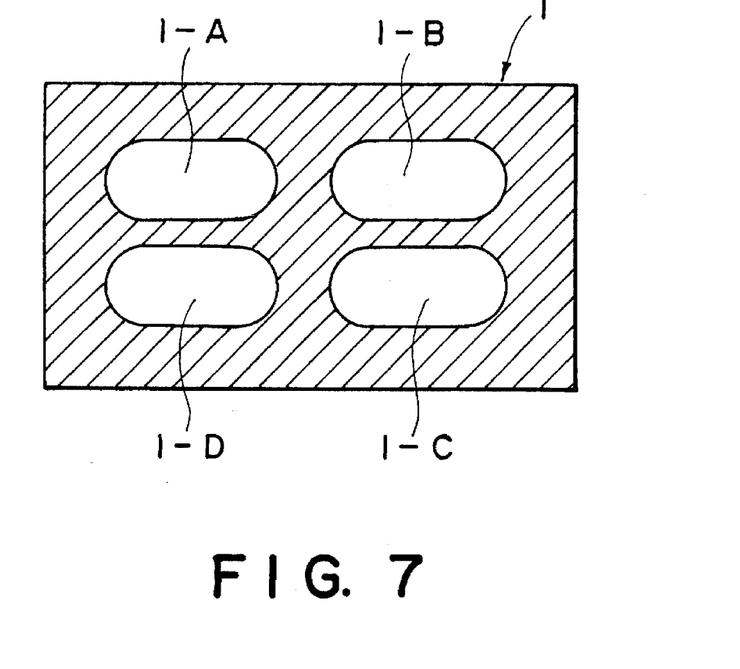
FIGS. 7, 9, and 10 show arrangements of unit solar cells for illustrating the solar cell arrays of the present invention.

FIG. 7 shows an arrangement of unit cells in a solar cell array in accordance with a preferred embodiment of the present invention. In an equivalent circuit of the solar cell of FIG. 7, pairs of unit cells (unit cells 1-A and 1-C, and unit cells 1-B and 1-D) are connected in parallel and the two parallel circuits are connected in series to form the solar cell array, as shown in the circuit diagram of FIG. 1.

In the solar cell array 1 of FIG. 7, the pairs of unit cells 1-A and 1-C, and 1-B and 1-D are connected in parallel; however, the unit cells 1-A and 1-C are arranged such that the adjacent unit cells 1-A and 1-C, and 1-B and 1-D are not arranged in the same row or same column.

Thus, even if a row or column of the solar cell array 1 is shaded, the overall generated current does not drastically decrease.

Namely, even if a row is shaded so as to drastically reduce the power generation ability of the unit cells 1-A and I-B, the unshaded unit cells 1-C and 1-D maintain their power generation capability. Thus, in the solar cell array 1 of FIG. 7 which has a circuit diagram as shown in FIG. 1, a current may flow between the two terminals through the unit cells 1-C and 1-D. Accordingly, one half of the power generation ability of the solar cell array 1 is assured and drastic decrease of the generated current to a small current on the order of the leakage current as occurred in the prior art is prevented.

Similarly, when a column of the solar cell array 1 is shaded so that the power generation ability of the unit cells 1-A and 1-D is drastically reduced, one half of the power generation capability of the solar cell array 1 having a circuit diagram as shown in FIG. 1 is assured by the power generation ability of the unit cells 1-B and 1-C. Accordingly, drastic decrease of the generated current to a small current, on the order of leakage current, as occurred in the prior art, is prevented.

Similarly, when other rows or columns of the solar cell array are shaded, the drastic decrease of the generated current to a small current, on the order of leakage current, is prevented.

Figure 8:
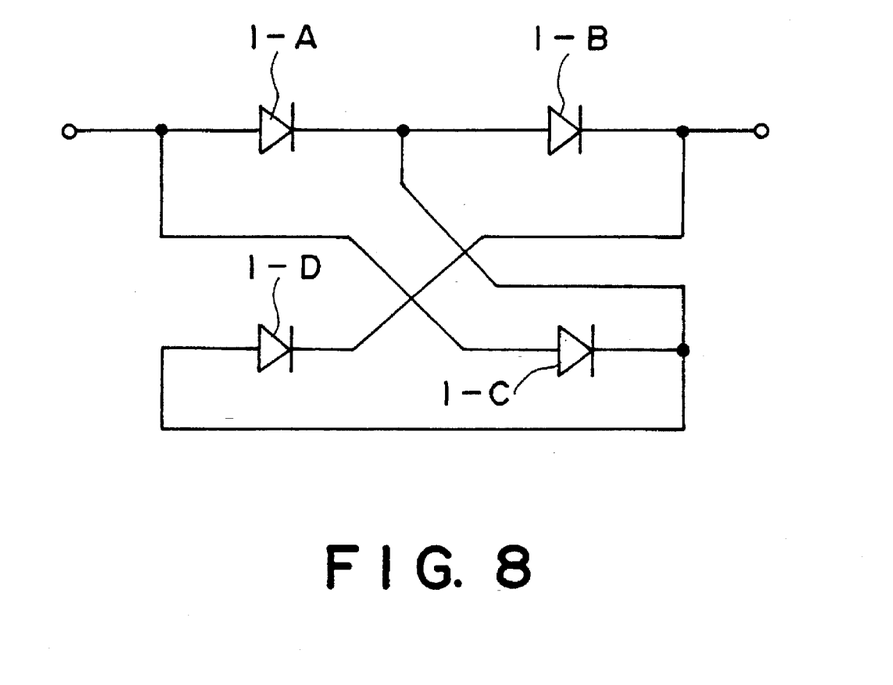
FIG. 8 shows a circuit diagram for illustrating the electrical connection of the unit cells of the present invention.

Electrical connection of the unit cell arrangement shown in FIG. 7 is shown in the circuit diagram of FIG. 8.

Embodiment 2

Figure 9:
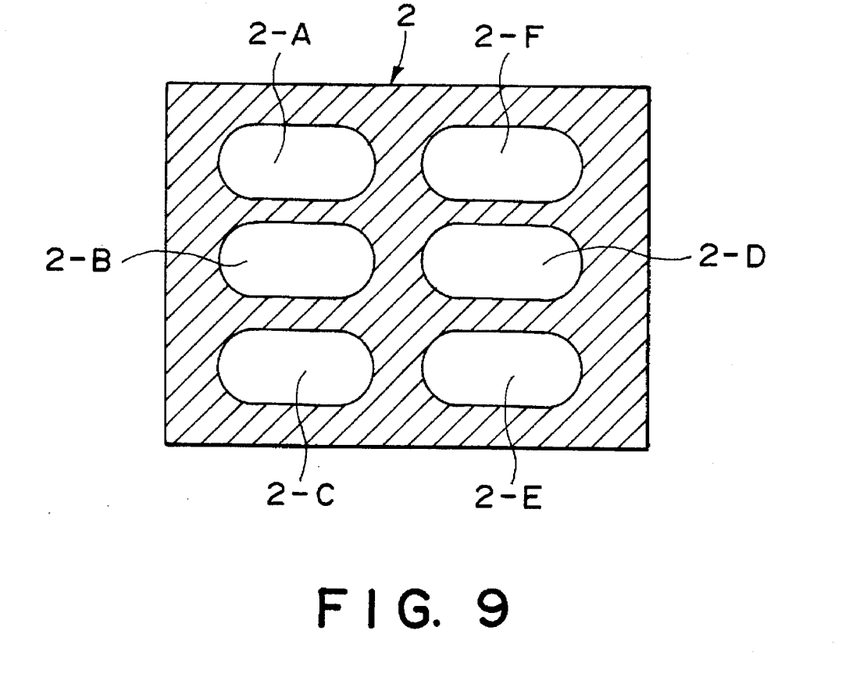

FIG. 9 shows an arrangement of unit cells of a solar cell array of a second embodiment of the present invention. In this solar cell array, three sets of two parallel-connected unit cells are connected in series, as shown in the circuit diagram of FIG. 3. As shown in FIG. 9, in the present embodiment, in the individual pairs of unit cells connected in parallel in the circuit diagram shown in FIG. 3, the adjacent unit cells 2-A and 2-D, 2-B and 2-E, and 2-C and 2-F are not arranged in the same row or same column.

Thus, even if a row or column of the solar cell array 2 is shaded so as to drastically reduce the power generation capability of the unit cells arranged in that row or column, drastic decrease of the overall generated current of the solar cell array is prevented, as in Embodiment 1.

Namely, in FIG. 9, even if a row is shaded so as to drastically reduce the power generation ability of the unit cells 2-A and 2-F, the power generation ability of the unit cells 2-B to 2-E is maintained and two-thirds of the generated current of the circuit shown in FIG. 3 is assured and drastic decrease of the generated current to a small current, on the order of leakage current, as occurred in the prior art, is prevented.

Similarly, in FIG. 9, even if a column is shaded so as to drastically reduce the power generation ability of the unit cells 2-A, 2-B, and 2-C, the power generation capability of the unit cells 2-A and 2-D to 2-F is maintained so that one half of the generated current of the circuit shown in FIG. 3 is assured and drastic decrease of the generated current to a small current on the order of the leakage current as occurred in the prior art is prevented.

Similarly, when other rows or columns are shaded, drastic decrease of the generated current to a small current on the order of the leakage current as occurred in the prior art is prevented.

Embodiment 3

Figure 10:
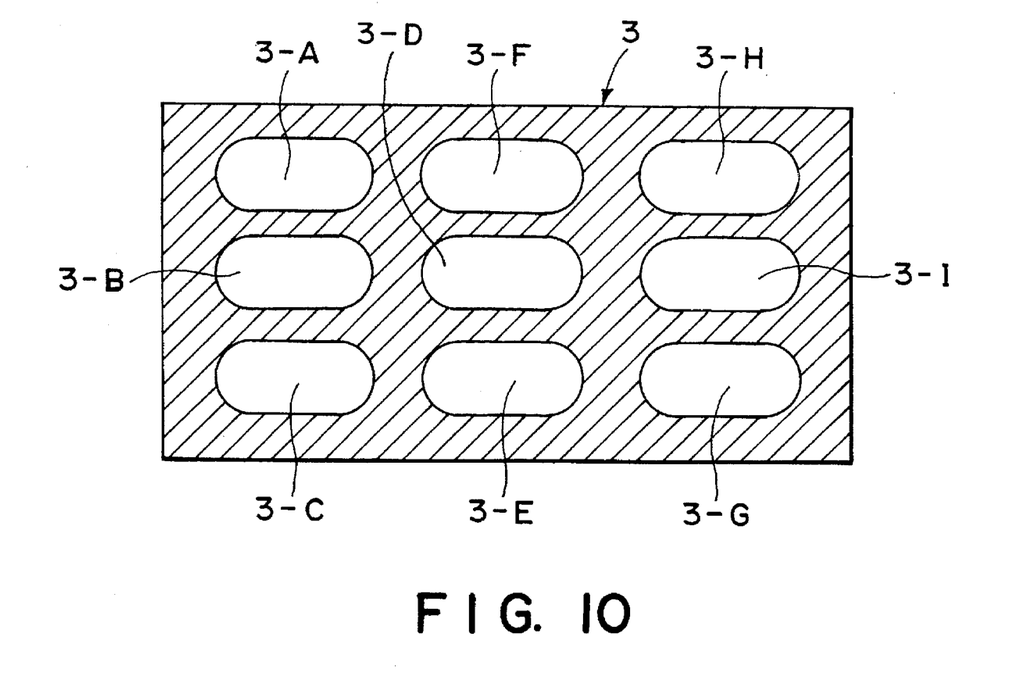

FIG. 10 shows an arrangement of unit cells of a solar cell array in accordance with a third embodiment of the present invention. In this solar cell array, three groups of three parallel-connected unit cells are connected in series to form the solar cell array shown in the circuit diagram of FIG. 5. In the present embodiment shown in FIG. 10, in the individual unit cells connected in parallel in the circuit diagram of the solar cell array shown in FIG. 5, the adjacent unit cells 3-A, 3-D, and 3-G; 3-B, 3-E, and 3-H; and 3-C, 3-F, and 3-I are not arranged in the same row or same column.

In the arrangement of FIG. 10, even if a row or column is shaded so as to drastically reduce the power generation capability of the unit cells of that row or column, the overall generated current of the solar cell array is not drastically decreased.

Namely, in FIG. 10, even if a row is shaded so as to drastically reduce the power generation capability of the unit cells 3-A, 3-F, and 3-H, the power generation ability of the unit cells 3-B and 3-E, and 3-G and 3-I is maintained so that two-thirds of the generated current of the circuit shown in FIG. 5 is assured and drastic decrease of the generated current to a small current, on the order of the leakage current, as occurred in the prior art, is prevented.

Similarly, in FIG. 10, even if a column is shaded so as to drastically reduce the power generation ability of the unit cells 3-A, 3-B, and 3-C, the power generation ability of the unit cells 3-D to 3-H is maintained and two-thirds of the generated current of the circuit shown in FIG. 5 is assured and drastic decrease of the generated current to a small current, on the order of leakage current, as occurred in the prior art, is prevented.

Similarly, when another row or column is shaded, drastic decrease of the generated current to a small current, on the order of the leakage current, as occurred in the prior art, is prevented.

Embodiment 4

An embodiment in which the solar cell 1 of the Embodiment 1 is applied to a desk top calculator as an electronic equipment is now explained.

Figure 11:
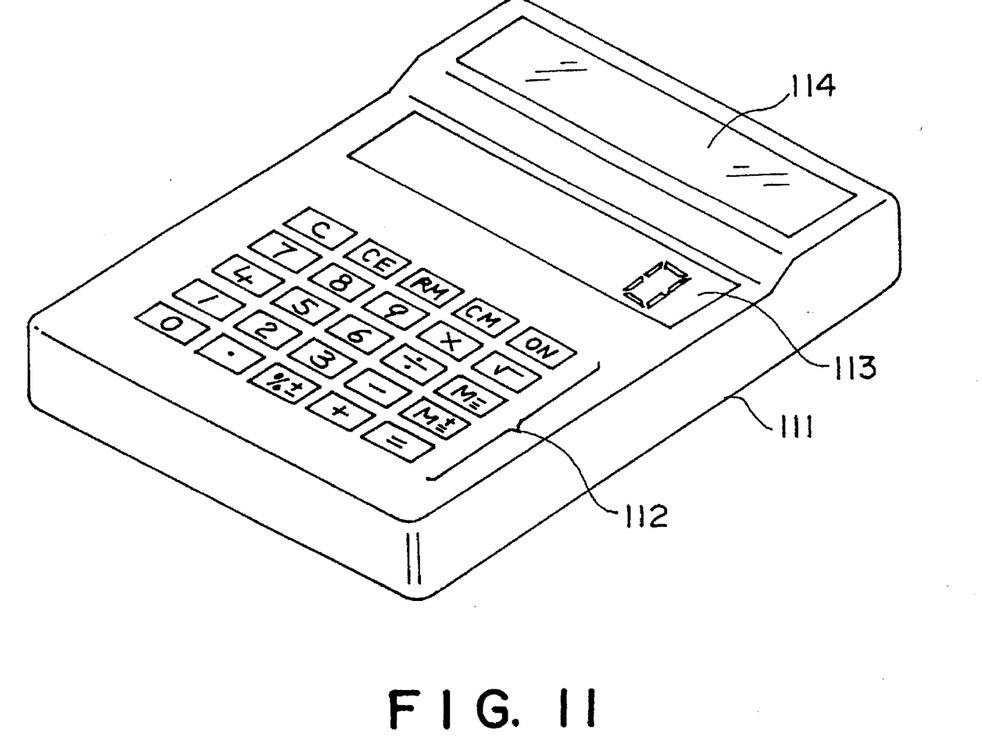
FIG. 11 shows a perspective view illustrating the solar cell array of the present invention applied to a calculator as an electronic equipment.

FIG. 11 shows a perspective view of the calculator of the present embodiment. Numeral 111 denotes the main body of the calculator, numeral 112 denotes the keyboard as an input unit having keys such as a zero–ten, operation keys, and a memory key, numeral 113 denotes a display unit for displaying an operation result, and numeral 114 denotes a solar cell.

Figure 12:
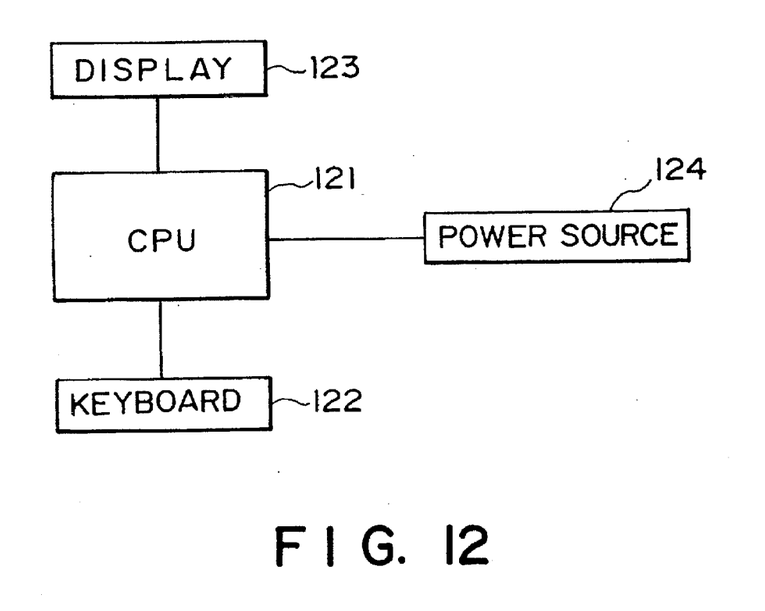
FIG. 12 shows a block diagram of the calculator.

FIG. 12 shows a block diagram of the present embodiment. An input from the keyboard 122 is applied to a CPU 121 and the input information and operation result are displayed on the display unit 123. The solar cell of the embodiment is used as a power source 124 to provide an output to the calculator in accordance with the incident light intensity.

When the solar cell of the Embodiment 1 is used for the above calculator, even if a portion of an eraser or a pen covers the solar cell, the solar cell can generate power and the functioning of the calculator is not disturbed and the calculation may continue.

Embodiment 5

An embodiment in which the solar cell of the present invention is applied to a camera as an electronic equipment is now described.

Figure 13:
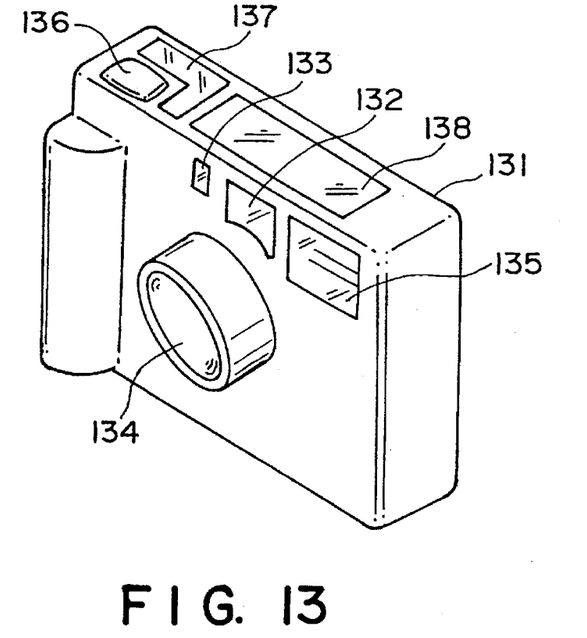
FIG. 13 shows a perspective view illustrating the solar cell of the present invention applied to a camera as the electronic equipment.

FIG. 13 shows a perspective view of a camera. In FIG. 13, numeral 131 denotes the camera body, numeral 132 denotes a sensor, numeral 133 denotes a range finder window, numeral 134 denotes a lens, numeral 135 denotes a strobe light, numeral 136 denotes a shutter button, numeral 137 denotes a display unit, and numeral 138 denotes a solar cell.

Figure 14:
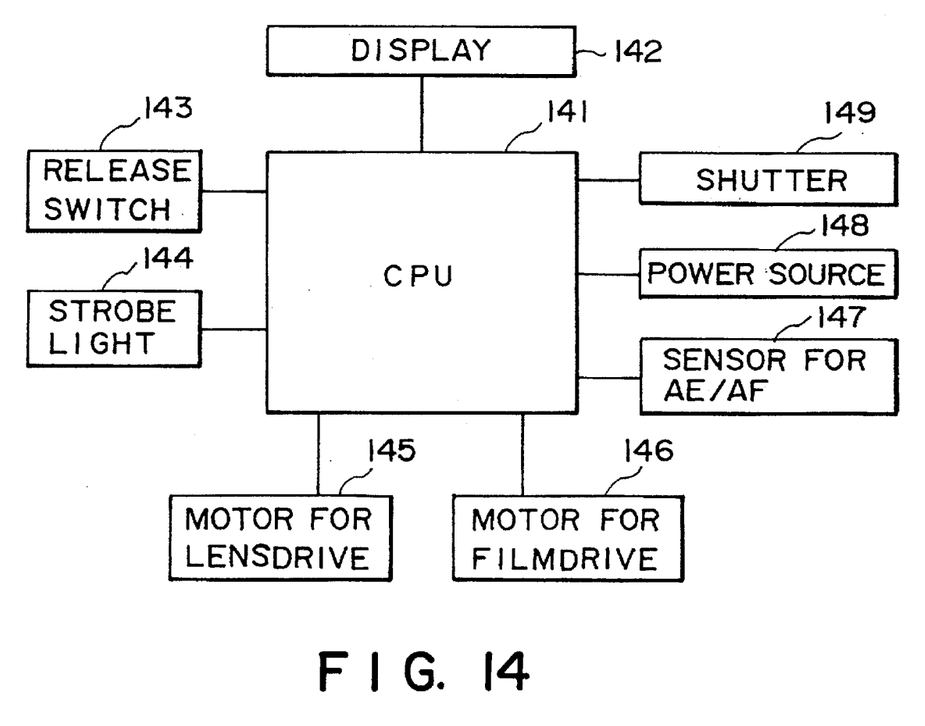
FIG. 14 shows a block diagram of the camera.

FIG. 14 shows a block diagram of the camera shown in FIG. 13. In FIG. 14, numeral 141 denotes a CPU, numeral 142 denotes a display unit, numeral 143 denotes a release switch, numeral 144 denotes a strobe light, numeral 145 denotes a motor for a lens drive, numeral 146 denotes a motor for a film drive, numeral 147 denotes a sensor for auto-exposure and/or auto-focusing, numeral 148 denotes a power source, and numeral 149 denotes a shutter.

The CPU 141 performs various operations and issues various commands. For example, in loading or unloading film or at the end of one-shot photographing, the CPU 141 issues a drive command to the motor 146 to feed a required length of film. The CPU 141 issues a command to drive the lens drive motor by an operation based on a signal from the sensor 147 to drive the lens or an iris diaphragm to a desired focusing position or aperture value. The CPU 141 controls the release time of the shutter 149 according to the sensor information. It sends a command to the strobe light 144 as required to fire the strobe light 144.

The CPU 141 also sends a signal to display the remaining number of frames and the exposure mode on the display unit.

These signals and commands are activated by turning on the release switch 143 by the release button to conduct the desired operation by the CPU 141.

The CPU 141 is connected to the power source 148 so that power required for the operation is supplied. Power to the drive motors 145 and 146 and the strobe light 144 are also supplied from the power source 148.

In the present embodiment, the solar cell of Embodiment 1 is used as the power source 148. As a result, even if a finger or hairs cover or obscure a portion of the solar cell or if the cell is shaded, current is supplied from the solar cell and the operation of the CPU 1 is not disturbed.

As described above, even if a row or column of the solar cell array is shaded and the power generation ability of the unit cells at the shaded position is drastically reduced, the entire power generation capability of the unit cells of one parallel circuit is not disabled and drastic decrease of the overall output current of the solar cell array is prevented. Further, stable power generation is attained.

The shape is not limited to the shade of a building, a tree, a human being or other object but the interception of light or the decrease of incident light intensity due to placement of an article on the solar cell is included.

In addition, the CPU in the above embodiment need not be a single one but it may comprise a plurality of CPU's. Accordingly, the present invention may be appropriately modified within the scope of the subject of the present invention. The electronic equipment is not limited to a calculator or a camera.

The photovoltaic elements may be manufactured by utilizing a non-single crystal semiconductor including an amorphous semiconductor, fine crystal semiconductor, polycrystal semiconductor, or a single crystal semiconductor. A silicon semiconductor is preferable. An element may comprise a pn junction structure having a p-type region and an n-type region or a pin structure having a p-type region and an n-type region sandwiching an i-type region, or a lamination of the pn structures and the pin structures.

What is claimed is:

1. A solar cell array having a plurality of parallel circuits of a plurality of unit solar cells each comprising a photovoltaic element, electrically connected in series;

wherein said plurality of unit cells are arranged in rows and columns, and at least one of the unit cells forming each of said parallel circuits is arranged in a non-adjacent row or column with respect to the other unit cells forming that parallel circuit.

2. A solar cell array according to claim 1 wherein said at least one unit cell is arranged in another row and column than the unit cells forming that parallel circuit.

3. A solar cell array according to claim 1 wherein said at least one unit cell is arranged in another row and column than those of the adjacent unit cells of said parallel circuit.

4. A solar cell array according to claim 1 wherein said unit cells are of substantially the same shape.

5. A solar cell array according to claim 1 wherein each said photovoltaic element has a non-single crystal semiconductor layer.

6. A solar cell array according to claim 1 wherein each said photovoltaic element has a single crystal semiconductor layer.

7. A solar cell array according to claim 1 wherein each said photovoltaic element has a pn or a pin junction structure.

8. An electronic equipment comprising:

a solar cell array having a plurality of parallel circuits of a plurality of unit solar cells, each comprising a photovoltaic element, electrically connected in series;

wherein said plurality of said unit solar cells are arranged in rows and columns, and at least one of the unit solar cells forming each of the parallel circuits is arranged in a non-adjacent row or column with respect to the other unit solar cells forming that parallel circuit.

9. An electronic equipment according to claim 8, wherein said electronic equipment is a calculator.

10. An electronic equipment according to claim 9, wherein said calculator has at least a keyboard, a display unit, and a CPU.

11. An electronic equipment according to claim 8, wherein said electronic equipment is a camera.

12. An electronic equipment according to claim 11, wherein said camera has at least a finder, a display unit, a shutter, and a CPU.

13. An electronic equipment according to claim 12, wherein said camera further includes at least one of a lens drive motor, a film feed motor, an exposure control sensor, a focus control sensor, and a strobe light.

* * * * *

UNITED STATES PATENT AND TRADEMARK OFFICE
CERTIFICATE OF CORRECTION

PATENT NO.  :   5,637,155
DATED       :   June 10, 1997
INVENTOR(S) :   Inoue

It is certified that error appears in the above-identified patent and that said Letters Patent is hereby corrected as shown below: On the title page:

Item: [56] References Cited

OTHER PUBLICATIONS

"tovoltair" should read --tovoltaic--.

COLUMN 3:

Line 40, "I-B," should read --1-B,--.

COLUMN 6:

Line 8, "shape" should read --shade--.

Signed and Sealed this

Twenty-seventh Day of January, 1998

Attest:

BRUCE LEHMAN

*Attesting Officer*       *Commissioner of Patents and Trademarks*